(12) United States Patent
Liang (10) Patent No.: US 8,963,157 B2
(45) Date of Patent: Feb. 24, 2015

(54) THIN FILM TRANSISTOR, ARRAY SUBSTRATE, AND MANUFACTURING METHOD THEREOF

(71) Applicant: BOE Technology Group Co., Ltd., Beijing (CN)

(72) Inventor: Yinan Liang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/994,244

(22) PCT Filed: Nov. 13, 2012

(86) PCT No.: PCT/CN2012/084543
§ 371 (c)(1),
(2) Date: Jun. 14, 2013

(87) PCT Pub. No.: WO2014/000367
PCT Pub. Date: Jan. 3, 2014

(65) Prior Publication Data
US 2014/0110718 A1    Apr. 24, 2014

(30) Foreign Application Priority Data
Jun. 29, 2012 (CN) .......................... 2012 1 0226591

(51) Int. Cl.
*H01L 29/10* (2006.01)
*H01L 21/02* (2006.01)
(Continued)

(52) U.S. Cl.
CPC .... *H01L 21/02672* (2013.01); *H01L 29/66757* (2013.01); *H01L 29/78675* (2013.01); *H01L 21/02532* (2013.01); *H01L 27/1277* (2013.01)

USPC .................. 257/66; 257/48; 257/58; 257/65; 257/72; 257/79; 438/149; 438/151; 438/162; 438/166; 438/300

(58) Field of Classification Search
None
See application file for complete search history.

(56) References Cited

U.S. PATENT DOCUMENTS 5,585,291 A    12/1996  Ohtani et al.
6,784,034 B1    8/2004  Choi
(Continued)

FOREIGN PATENT DOCUMENTS

CN    1351371 A    5/2002
CN    1355554 A    6/2002
(Continued)

OTHER PUBLICATIONS

Third Chinese Office Action dated May 30, 2014; Appln. No. 201210226591.5.

(Continued)

*Primary Examiner* — Kyoung Lee
(74) *Attorney, Agent, or Firm* — Ladas & Parry LLP (57) ABSTRACT

A thin film transistor, an array substrate, and a manufacturing method thereof. The manufacturing method comprises: forming a buffer layer and an active layer sequentially on a substrate, and forming an active region through a patterning process; forming a gate insulating layer and a gate electrode sequentially; forming Ni deposition openings; forming a dielectric layer having source/drain contact holes in a one-to-one correspondence with the Ni deposition openings; and forming source/drain electrodes which are connected with the active region via the source/drain contact holes and the Ni deposition openings.

8 Claims, 4 Drawing Sheets

(51) Int. Cl.
 *H01L 29/66* (2006.01)
 *H01L 29/786* (2006.01)
 *H01L 27/12* (2006.01)

(56) References Cited

U.S. PATENT DOCUMENTS

| | | |
|---|---|---|
| 2002/0068392 A1 | 6/2002 | Lee et al. |
| 2002/0074548 A1* | 6/2002 | Lee et al. ............. 257/59 |
| 2002/0177283 A1* | 11/2002 | Hwang et al. ............. 438/300 |
| 2003/0113957 A1 | 6/2003 | So |
| 2004/0110329 A1 | 6/2004 | Joo et al. |
| 2005/0110022 A1 | 5/2005 | Kim et al. |
| 2005/0110089 A1 | 5/2005 | Kim et al. |
| 2006/0049753 A1 | 3/2006 | Kang et al. |

FOREIGN PATENT DOCUMENTS

| | | |
|---|---|---|
| CN | 1431718 A | 7/2003 |
| CN | 1773720 A | 5/2006 |
| CN | 100521222 A | 7/2009 |
| CN | 1649174 A | 4/2010 |
| CN | 102751200 A | 10/2012 |
| JP | 2002299348 A | 10/2002 |
| JP | 4202987 B2 | 12/2008 |
| KR | 200220033373 A | 5/2002 |
| KR | 20050023162 A | 3/2005 |
| KR | 20090072099 A | 7/2009 |

OTHER PUBLICATIONS

International Search Report mailed Apr. 4, 2013, PCT/CN2012/084543.
First Chinese Office Action dated Jan. 10, 2014: Appln. No. 201210226591.5.
Second Chinese Office Action dated Mar. 20, 2014: Appln. No. 201210226591.5.
Fourth Chinese Office Action dated Aug. 26, 2014; Appln. No. 201210226591.5.
Korean Notice of Allowance dated Sep. 18, 2014; Appln. No. 10-2013-7015277.
International Preliminary Report on Patentability dated Dec. 31, 2014.

* cited by examiner

THIN FILM TRANSISTOR, ARRAY SUBSTRATE, AND MANUFACTURING METHOD THEREOF

FIELD OF THE INVENTION

Embodiments of the invention relate to a thin film transistor, an array substrate, and a manufacturing method thereof.

BACKGROUND OF THE INVENTION

Organic Light-Emitting Display (OLED) is a new flat-panel display device, and it has a broad application prospect because of its advantages, such as simple preparation processes, low cost, fast response speed, easiness for realizing a color display and a large-screen display, low power consumption, easiness for matching with an integrated driver circuit, high brightness, a wide range of adaptive working temperature, small volume, light weight, and easiness for realizing a flexible display, etc.

According to different driving modes, OLEDs can be classified into two types: a Passive-Matrix OLED (PMOLED, Passive-Matrix Organic Light Emission Display) and an Active-Matrix OLED (AMOLED, Active-Matrix Organic Light Emission Display). The passive matrix driving mode, although simple in processes and relatively low in cost, cannot meet the requirements of a high-resolution large-size display due to its disadvantages such as crosstalk, high power consumption, and short service life, etc. In contrast, the active matrix driving mode, because thin film transistors (TFTs) are added on the panel such that pixel units are capable of emitting light during every frame time, requires small driving current, and has low power consumption and longer service life, and therefore can meet the requirements of a high-resolution multi-grayscale large-size display.

At present, for an AMOLED display driver circuit, there are mainly two types: one is the use of amorphous silicon (a-Si) TFTs; the other is the use of poly silicon (p-Si) TFTs. The a-Si TFT technology, although simple in processes and low in cost, cannot provide sufficient drive current due to its very low carrier mobility, and since amorphous silicon TFTs can only provide N-type devices, it also has a stability problem under the effect of a long-term stress. The poly silicon TFT, because of its high carrier mobility and fast response speed, is easy for realizing a large-area dynamic video display. Meanwhile, by virtue of the high carrier mobility, the poly silicon TFTs can be utilized to integrate a peripheral driver circuit onto the display rear panel; this greatly reduces external leading wires, and reduces the complexity of the peripheral driver circuit. Currently, poly silicon TFTs are commonly adopted in the world in the research and development of an AMOLED rear panel.

Compared with amorphous silicon TFT technology which requires only 4-5 times of photolithography, low-temperature poly silicon TFT technology is more complex in processes and higher in cost. All the currently known manufacturing procedures of a low-temperature poly silicon thin film transistor usually require 6 or more times of photolithography, with complex processes, high manufacturing costs, and a relative long production cycle. The more times of photolithography, the more difficult to improve the yield. Therefore, the times of photolithography can be used to measure the complexity of a manufacturing procedure of a low-temperature poly silicon thin film transistor, and a reduction in the times of photolithography means a reduction in manufacturing costs.

Thus, it is desired to reduce the times of photolithography, in order to shorten the production cycle of a low-temperature poly silicon thin film transistor, and to reduce the manufacturing costs of the low-temperature poly silicon thin film transistor.

SUMMARY OF THE INVENTION

One aspect of the embodiments of the present invention provides a manufacturing method of a thin film transistor, comprising steps of:

forming a buffer layer and an active layer sequentially on a substrate, and forming an active region through a patterning process on the active layer;

forming a gate insulating layer and a gate electrode sequentially;

forming Ni deposition openings;

forming a dielectric layer having source/drain contact holes in a one-to-one correspondence with the Ni deposition openings; and forming source/drain electrodes which are connected with the active region via the source/drain contact holes and the Ni deposition openings.

In one embodiment of the invention, materials of the active layer and the gate electrode are amorphous silicon thin film, respectively; between the step of forming the Ni deposition openings and the step of forming the dielectric layer, the method further comprises a step of:

crystallizing the amorphous silicon thin film material of both the active layer and the gate electrode into poly silicon thin film material by utilizing a metal-induced lateral crystallization method.

In one embodiment of the invention, the step of crystallizing the amorphous silicon thin film material of both the active layer and the gate electrode into poly silicon thin film material by utilizing the metal-induced lateral crystallization method comprises:

depositing metal Ni in the Ni deposition openings and on the gate electrode, and implanting source/drain ions into the Ni deposition openings so as to form source/drain regions, then performing a high-temperature annealing.

In one embodiment of the invention, materials of the buffer layer and the dielectric layer are $SiO_2$, $SiN_x$, or a mixture thereof, respectively; material of the source/drain electrodes is Mo, a conductive metal, or a conductive alloy.

In one embodiment of the invention, both a number of the Ni deposition openings and a number of the source/drain contact holes are two, respectively.

Another aspect of the embodiments of the invention further provides a manufacturing method of an array substrate, comprising steps of:

forming a buffer layer and an active layer sequentially on a substrate, and forming an active region through a patterning process on the active layer;

forming a gate insulating layer and a gate electrode sequentially;

forming Ni deposition openings;

forming a dielectric layer having source/drain contact holes in a one-to-one correspondence with the Ni deposition openings;

forming source/drain electrodes which are connected with the active region via the source/drain contact holes and the Ni deposition openings; and forming a pixel defining and insulating layer so as to form a pixel array.

In one embodiment of the invention, materials of the active layer and the gate electrode are amorphous silicon thin film, respectively; between the step of forming the Ni deposition openings and the step of forming the dielectric layer, the method further comprises a step of:

crystallizing the amorphous silicon thin film material of both the active layer and the gate electrode into poly silicon thin film material by utilizing a metal-induced lateral crystallization method.

In one embodiment of the invention, the step of crystallizing the amorphous silicon thin film material of both the active layer and the gate electrode into poly silicon thin film material by utilizing the metal-induced lateral crystallization method comprises:

depositing metal Ni in the Ni deposition openings and on the gate electrode, and implanting source/drain ions into the Ni deposition openings so as to source/drain regions, then performing a high-temperature annealing.

Still another aspect of the embodiments of the invention provides a thin film transistor, comprising:

a buffer layer and an active region sequentially formed on a substrate;

a gate insulating layer having Ni deposition openings, a gate electrode, and a dielectric layer having source/drain contact holes which are sequentially overlaid on the buffer layer and the active region, and the source/drain contact holes being in a one-to-one correspondence with the Ni deposition openings; and source/drain electrodes connected with the active region via the source/drain contact holes and the Ni deposition openings.

Still another aspect of the embodiments of the invention provides an array substrate, comprising:

a substrate;

a buffer layer and an active region sequentially formed on the substrate;

a gate insulating layer having Ni deposition openings, a gate electrode, and a dielectric layer having source/drain contact holes which are sequentially overlaid on the buffer layer and the active region, and the source/drain contact holes being in a one-to-one correspondence with the Ni deposition openings;

source/drain electrodes connected with the active region via the source/drain contact holes and the Ni deposition openings; and a pixel defining and insulating layer overlaid on the dielectric layer and the source/drain electrodes.

The embodiments of the present invention disclose a thin film transistor, an array substrate, and a manufacturing method thereof. The utilization of the above manufacturing method in accordance with the embodiments of the present invention to manufacture a thin film transistor, adopts only 5 times of photolithography process, and thus simplifies the processing procedure, reduces the production costs, and improves the yield. The use of metal-induced lateral crystallization technology to implement a poly silicon crystallization process, and the use of a low-temperature poly silicon layer as a gate electrode, improve the interface with gate dielectric layer, and can lower the threshold voltage and reduce the leakage current, and thus achieve a technical effect of a simplified processing procedure and an enhanced device performance. The thin film transistor manufactured by utilizing the above manufacturing method in accordance with the embodiments of the present invention can be applied in fields such as an Active-Matrix Organic Light-Emitting Display (AMOLED) and a Low-Temperature Poly silicon thin film-transistor Liquid Crystal Display (LTPS-LCD), etc.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

At present, amorphous silicon crystallization methods for forming poly silicon may include: an Excimer Laser Annealing (ELA) method, a Sequential Lateral Solidification (SLS) method, a Metal-Induced Crystallization (MIC) method, or a Metal-Induced Lateral Crystallization (MILC) method.

Among these methods, MILC technology, compared with ELA and SLS technologies, is better in uniformity of TFT devices, and easier to meet the requirements of a large-size AMOLED display; meanwhile, the MILC technology is cheaper in costs. Moreover, MILC technology, compared with MIC technology, can effectively reduce residual-metal contamination in a channel region. Therefore, MILC technology is very suitable for applications in a future large-size AMOLED.

The First Embodiment

Figure 1:
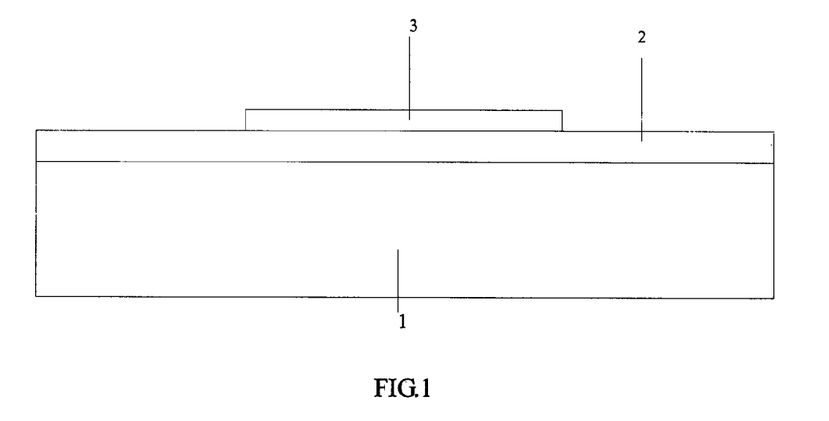
FIG. 1 is a schematic structural diagram of a thin film transistor shown in step A in a first embodiment of the present invention.

With reference to FIG. 1 to FIG. 6, the embodiment of the invention provides a manufacturing method of a thin film transistor, and this technology can reduce the number of masks required in the manufacturing procedure, thereby simplifying the processing procedure and improving the yield; the method comprises the steps as follows:

Step A: as shown in FIG. 1, a buffer layer 2 and an active layer are sequentially formed on a substrate 1 which may be a substrate of quartz glass, ordinary glass or plastic, or the like; the buffer layer 2 is used to protect a channel region, and the buffer layer 2 may have a thickness of 2000~4000 Å

Figure 2:
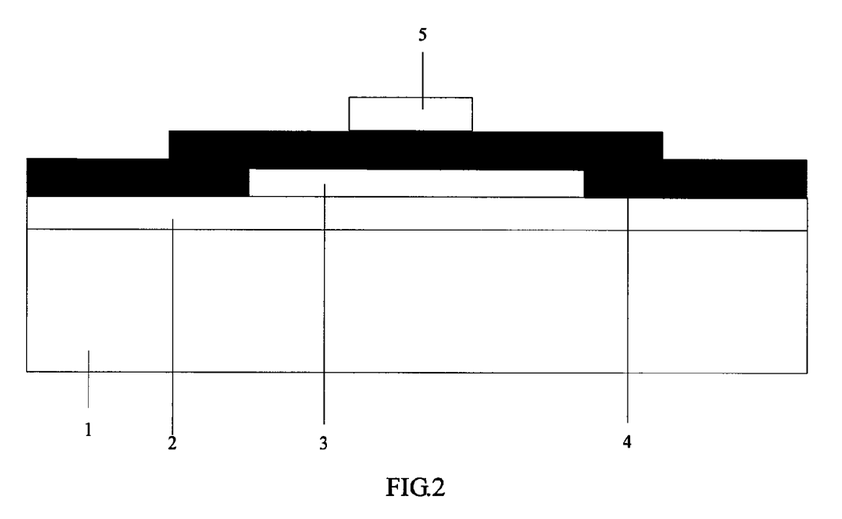
FIG. 2 is a schematic structural diagram of the thin film transistor shown in step B in the first embodiment of the present invention.
Figure 3:
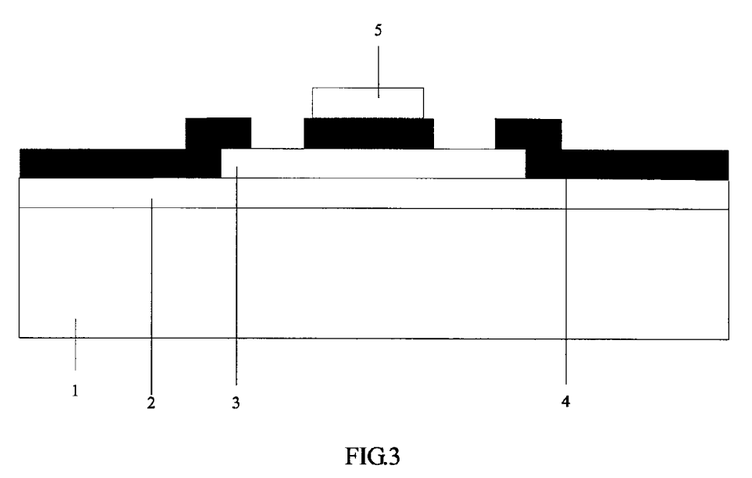
FIG. 3 is a schematic structural diagram of the thin film transistor shown in step C in the first embodiment of the present invention.
Figure 4:
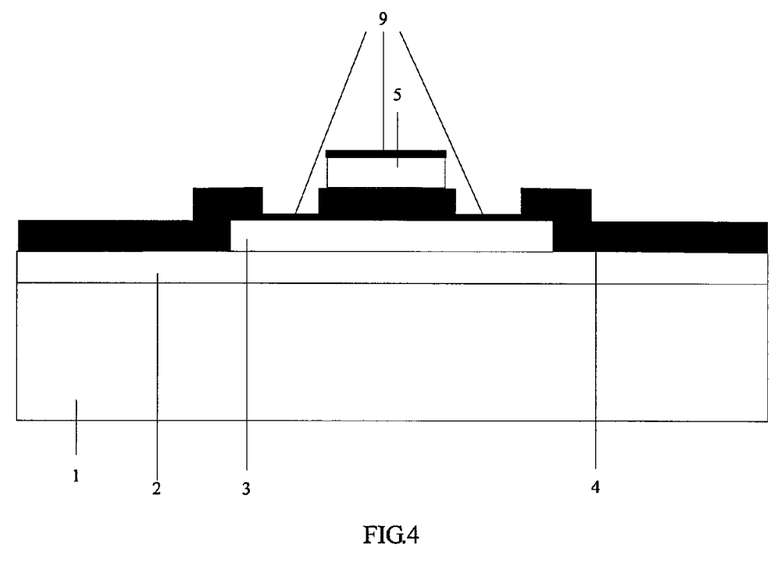
FIG. 4 is a schematic structural diagram of the thin film transistor shown in step D in the first embodiment of the present invention.
Figure 5:
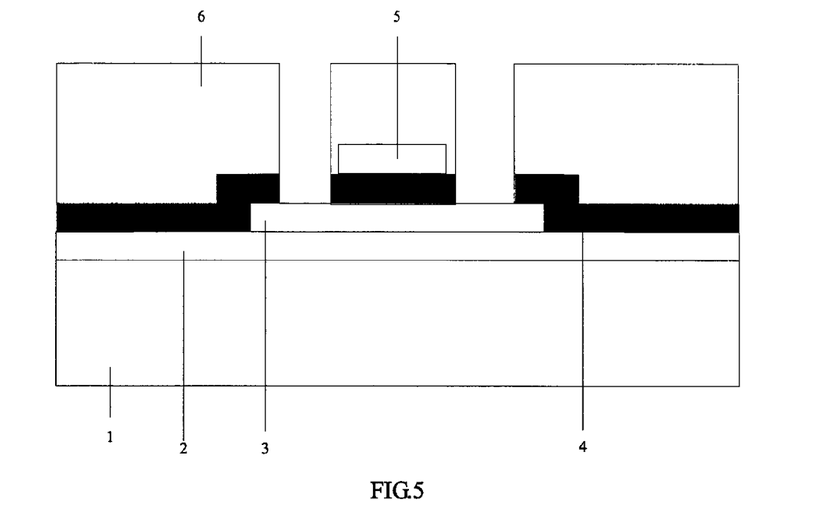
FIG. 5 is a schematic structural diagram of the thin film transistor shown in step E in the first embodiment of the present invention.
Figure 6:
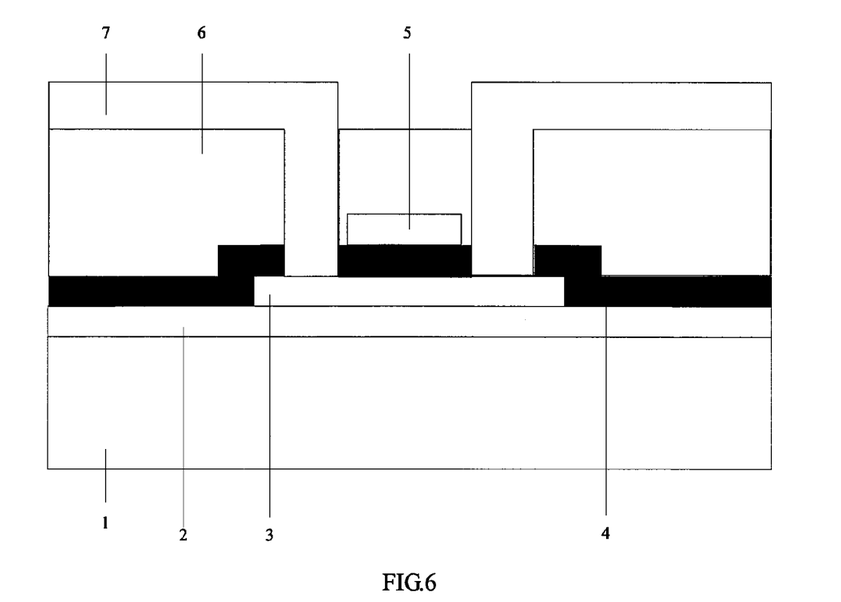
FIG. 6 is a schematic structural diagram of the thin film transistor shown in step F in the first embodiment of the present invention.

(angstrom), and the material of the buffer layer 2 may be $SiO_2$ (silicon dioxide), $SiN_x$ (silicon nitride), or a mixture thereof; the active layer may have a thickness of 500~800 Å, and the material of the active layer may be an amorphous silicon (a-Si) thin film, and then an active layer 3 is formed, for example through a patterning process (i.e., an active-layer mask process, referred to as Active-Mask) performed on the amorphous silicon (a-Si) thin film;

Step B: as shown in FIG. 2, a gate insulating layer 4 and a gate electrode layer are sequentially formed, in which the gate insulating layer 4 may have a thickness of 800~1500 Å; the gate electrode layer may have a thickness of 1500~2500 Å, and the material of the gate electrode layer may be an amorphous silicon (a-Si) thin film, and then a gate electrode 5 can be formed, for example through a patterning process performed on the gate electrode layer;

Step C: as shown in FIG. 3, Ni (Nickel) deposition openings are formed, for example through a patterning process (i.e., a Ni mask process, referred to as Ni-Mask) performed on the gate insulating layer; for instance, two Ni (Nickel) deposition openings may be formed;

Step D: as shown in FIG. 4, by utilizing a metal-induced lateral crystallization method, the amorphous silicon thin film material of both the active region 3 and the gate electrode 5 is crystallized into poly silicon thin film material;

This step specifically comprises steps as follows: metal Ni 9, as a precursor-metal used for the metal-induced lateral crystallization, is deposited in the Ni deposition openings and on the gate electrode 5, and source/drain ions are implanted into the Ni deposition openings, thus source/drain regions are formed, and then a high-temperature annealing is performed;

Step E: as shown in FIG. 5, a dielectric layer 6 is formed, and the dielectric layer 6 may have a thickness of 2000~4000 Å, and the material of the dielectric layer 6 may be $SiO_2$, $SiN_x$ or a mixture of thereof; and then source/drain contact holes are formed in positions corresponding to the Ni deposition openings, for example through a patterning process (i.e., a contact-hole mask process, referred to as CNT-Mask) performed on the dielectric layer 6;

Step F: as shown in FIG. 6, a source/drain metal layer is formed, and the source/drain metal layer may have a thickness of 2000~3500 Å, and the material of the source/drain metal layer may be Mo or other conductive metals or alloys; and then source/drain electrodes 7 are formed, for example through a patterning process (i.e., a source/drain mask process, referred to as SD-Mask) performed on the source/drain metal layer, and the source/drain electrodes 7 are connected with the active region 3 via the source/drain contact holes and the Ni deposition openings, meanwhile the source/drain electrodes 7 are separated from the gate electrode 5 by the dielectric layer 6.

Each patterning process described in the embodiment, generally comprises processes such as applying photoresist, exposing with a mask, developing, etching, and removing photoresist, etc.

The utilization of the above manufacturing method in accordance with the embodiment of the present invention to manufacture a thin film transistor adopts only 5 times of photolithography processes, and thus simplifies the processing procedure, reduces the production costs, and improves the yield.

The use of metal-induced lateral crystallization technology to implement a poly silicon crystallization process, and the use of a low-temperature poly silicon layer as a gate electrode, improve the interface with the gate dielectric layer, and can lower the threshold voltage and reduce the leakage current, and thus achieve a technical effect of a simplified processing procedure and an enhanced device performance.

The thin film transistor manufactured by utilizing the above manufacturing method in accordance with the embodiment of the present invention can be applied in fields such as an Active-Matrix Organic Light-Emitting Display (AMOLED) and a Low-Temperature Poly-Silicon thin film-transistor Liquid Crystal Display (LTPS-LCD), etc.

The Second Embodiment

Figure 7:
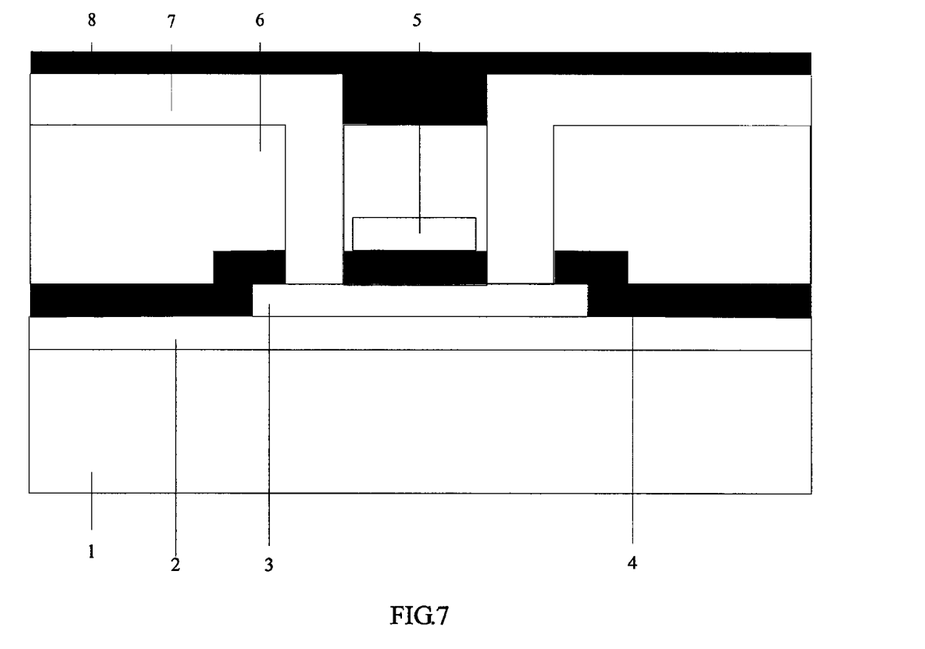
FIG. 7 is a schematic structural diagram of the thin film transistor shown in step G in the first embodiment of the present invention.

The manufacturing method of an array substrate in accordance with this embodiment of the invention comprises the steps of the above-described manufacturing method of a thin film transistor in accordance with the first embodiment of the invention; and further comprises the steps as follows:

Step G: as shown in FIG. 7, a pixel defining and insulating layer 8 (PI) is formed, and the pixel defining and insulating layer 8 may have a thickness of 1~2 um; and then a pixel array may be formed, for example through a patterning process performed on the pixel defining and insulating layer 8.

The patterning process described in the embodiment, generally comprises processes such as applying photoresist, exposing with a mask, developing, etching, and removing photoresist, etc.

The utilization of the above manufacturing method in accordance with the embodiment of the present invention to manufacture an array substrate adopts only 6 times of photolithography process, and thus simplifies the processing procedure, reduces the production costs, and improves the yield.

The use of metal-induced lateral crystallization technology to implement a poly silicon crystallization process, and the use of a low-temperature poly silicon layer as a gate electrode, improve the interface with the gate dielectric layer, and can lower the threshold voltage and reduce the leakage current, and thus achieve a technical effect of a simplified processing procedure and an enhanced device performance.

The array substrate manufactured by utilizing the manufacturing method in accordance with the embodiment of the invention can be applied in fields such as an Active-Matrix Organic Light-Emitting Display (AMOLED) and a Low-Temperature Poly-Silicon thin film-transistor Liquid Crystal Display (LTPS-LCD), etc.

The Third Embodiment

As shown in FIG. 5, the thin film transistor in accordance with the embodiment of the invention, comprises: a buffer layer 2 and an active region 3 sequentially formed on a substrate 1 which may be a substrate of quartz glass, ordinary glass or plastic, or the like; the buffer layer 2 is used to protect a channel region, and the buffer layer 2 may have a thickness of 2000~4000 Å (angstrom), and the material of the buffer layer 2 may be $SiO_2$ (silicon dioxide), $SiN_x$ (silicon nitride), or a mixture thereof; the active region 3 may have a thickness of 500~800 Å, and the material of the active region 3 may be a poly silicon thin film; the thin film transistor also comprises: a gate insulating layer 4 having (e.g., two) Ni deposition openings, a gate electrode 5, and a dielectric layer 6 having source/drain contact holes which are sequentially overlaid on the buffer layer 2 and the active region 3, the source/drain contact holes being in a one-to-one correspondence with the Ni deposition openings. The gate insulating layer 4 may have a thickness of 800~1500 Å; the gate electrode 5 may have a thickness of 1500~2500 Å, and the material of the gate electrode 5 may be a poly silicon thin film; the dielectric layer 6 may have a thickness of 2000~4000 Å, and the material of the dielectric layer 6 may be SiO$_2$, SiN$_x$ or a mixture thereof; moreover, the thin film transistor comprises: source/drain electrodes 7 which are connected with the active region 3 via the source/drain contact holes and the Ni deposition openings, the source/drain electrodes 7 are separated from the gate electrode 5 by the dielectric layer 6.

In the above thin film transistor in accordance with the embodiment of the invention, the use of metal-induced lateral crystallization technology to implement a poly silicon crystallization process, and the use of a low-temperature poly silicon layer as a gate electrode, improve the interface with the gate dielectric layer, and can lower the threshold voltage and reduce the leakage current, and thus achieve a technical effect of a simplified processing procedure and an enhanced device performance.

The thin film transistor in accordance with the embodiment of the invention can be applied in fields such as an Active-Matrix Organic Light-Emitting Display (AMOLED) and a Low-Temperature Poly-Silicon thin film-transistor Liquid Crystal Display (LTPS-LCD), etc.

The Fourth Embodiment

The array substrate in accordance with the embodiment of the invention comprises a thin film transistor as described above in the third embodiment, and further comprises:

a pixel defining and insulating layer 8 (PI) overlaid on the dielectric layer 6 and the source/drain electrodes 7, in which the pixel defining and insulating layer 8 may have a thickness of 1~2 um, and the pixel defining and insulating layer 8 (PDL-Mask) is used to form a pixel array.

In the array substrate in accordance with the embodiment of the invention, the use of metal-induced lateral crystallization technology to implement a poly-Silicon crystallization process, and the use of a low-temperature poly silicon layer as a gate electrode, improve the interface with the gate dielectric layer, and can lower the threshold voltage and reduce the leakage current, and thus achieve a technical effect of a simplified processing procedure and an enhanced device performance.

The array substrate in accordance with the embodiment of the invention can be applied in fields such as an Active-Matrix Organic Light-Emitting Display (AMOLED) and a Low-Temperature Poly-Silicon thin film-transistor Liquid Crystal Display (LTPS-LCD), etc.

In summary, the embodiments of the present invention disclose a thin film transistor, an array substrate, and a manufacturing method thereof. The utilization of the above manufacturing method in accordance with the embodiment of the present invention to manufacture a thin film transistor adopts only 5 times of photolithography process, and thus simplifies the processing procedure, reduces the production costs, and improves the yield. The use of metal-induced lateral crystallization technology to implement a poly-Silicon crystallization process, and the use of a low-temperature poly silicon layer as a gate electrode, improve the interface with the gate dielectric layer, and can lower the threshold voltage and reduce the leakage current, and thus achieve a technical effect of a simplified processing procedure and an enhanced device performance. The thin film transistor manufactured by utilizing the above manufacturing method in accordance with the embodiment of the present invention can be applied in fields such as an Active-Matrix Organic Light-Emitting Display (AMOLED) and a Low-Temperature Poly-Silicon thin film-transistor Liquid Crystal Display (LTPS-LCD), etc.

The above are merely exemplary implementations of the present invention, but not for limiting the scope of the invention; instead, the scope of the invention should be defined by the appended claims.

What is claimed is:

1. A manufacturing method of a thin film transistor, comprising steps of:
    forming a buffer layer and an active layer sequentially on a substrate, and forming an active region through a patterning process on the active layer;
    forming a gate insulating layer and a gate electrode sequentially;
    forming Ni deposition openings;
    forming a dielectric layer having source/drain contact holes in a one-to-one correspondence with the Ni deposition openings; and
    forming source/drain electrodes which are connected with the active region via the source/drain contact holes and the Ni deposition openings;
    wherein materials of the active layer and the gate electrode are amorphous silicon thin film, respectively;
    between the step of forming the Ni deposition openings and the step of forming the dielectric layer the method further comprises a step of:
    crystallizing the amorphous silicon thin film material of both the active layer and the gate electrode into polysilicon thin film material by utilizing a metal induced lateral crystallization method.

2. The manufacturing method according to claim 1, wherein the step of crystallizing the amorphous silicon thin film material of both the active layer and the gate electrode into poly silicon thin film material by utilizing the metal-induced lateral crystallization method comprises:
    depositing metal Ni in the Ni deposition openings and on the gate electrode, and implanting source/drain ions into the Ni deposition openings so as to form source/drain regions, then performing a high-temperature annealing.

3. The manufacturing method according to claim 1, wherein materials of the buffer layer and the dielectric layer are SiO$_2$, SiN$_x$, or a mixture thereof, respectively; material of the source/drain electrodes is Mo, a conductive metal, or a conductive alloy.

4. The manufacturing method according to claim 1, wherein both a number of the Ni deposition openings and a number of the source/drain contact holes are two, respectively.

5. A manufacturing method of an array substrate, comprising steps of:
    forming a buffer layer and an active layer sequentially on a substrate, and forming an active region through a patterning process on the active layer;
    forming a gate insulating layer and a gate electrode sequentially;
    forming Ni deposition openings;
    forming a dielectric layer having source/drain contact holes in a one-to-one correspondence with the Ni deposition openings;
    forming source/drain electrodes which are connected with the active region via the source/drain contact holes and the Ni deposition openings; and
    forming a pixel defining and insulating layer so as to form a pixel array;
    wherein materials of the active layer and the gate electrode are amorphous silicon thin film, respectively;
    between the step of forming the Ni deposition openings and the step of forming the dielectric layer, the method further comprises a step of:

crystallizing the amorphous silicon thin film material of both the active layer and the electrode into silicon thin film material by utilizing a metal-induced lateral crystallization method.

6. The manufacturing method according to claim 5, wherein the step of crystallizing the amorphous silicon thin film material of both the active layer and the gate electrode into poly silicon thin film material by utilizing the metal-induced lateral crystallization method comprises:

depositing metal Ni in the Ni deposition openings and on the gate electrode, and implanting source/drain ions into the Ni deposition openings so as to source/drain regions, then performing a high-temperature annealing.

7. The manufacturing method according to claim 5, wherein materials of the buffer layer and the dielectric layer are $SiO_2$, $SiN_x$, or a mixture thereof, respectively; material of the source/drain electrodes is Mo, a conductive metal, or a conductive alloy.

8. The manufacturing method according to claim 5, wherein both a number of the Ni deposition openings and a number of the source/drain contact holes are two, respectively.

* * * * *